United States Patent [19]

Mosch et al.

[11] 3,824,679

[45] July 23, 1974

[54] METHOD OF MAKING SEMICONDUCTOR COMPONENT WITH SHEET METAL CONNECTOR LEADS

[75] Inventors: Willi Mosch, Munich; Gerhard Lutz, Erlangen; Heinz Martin, Munich, all of Germany

[73] Assignee: Siemens Aktiengesellschaft, Munich, Berlin, Germany

[22] Filed: Oct. 13, 1970

[21] Appl. No.: 80,465

Related U.S. Application Data

[60] Division of Ser. No. 18,797, March 16, 1970, abandoned, which is a continuation of Ser. No. 719,193, April 5, 1968, abandoned.

[30] Foreign Application Priority Data

Apr. 8, 1967 Germany .............................. 109258

[52] U.S. Cl. ......................... 29/588, 29/589, 29/591

[51] Int. Cl. ............................................. B01j 17/00

[58] Field of Search ...... 29/576 S, 589, 588, 630 G, 29/591; 174/3 FP; 113/119

[56] References Cited

UNITED STATES PATENTS

| | | | |
|---|---|---|---|
| 3,076,253 | 2/1963 | Cornelison et al | 29/25.3 |
| 3,348,105 | 10/1967 | Doyle | 317/234 |
| 3,444,441 | 5/1969 | Helda et al. | 317/234 |
| 3,569,797 | 3/1971 | Simmons | 317/234 |

FOREIGN PATENTS OR APPLICATIONS

| | | | |
|---|---|---|---|
| 1,072,283 | 5/1959 | Germany | 29/630 G |

*Primary Examiner*—W. Tupman
*Attorney, Agent, or Firm*—Herbert L. Lerner

[57] ABSTRACT

A semiconductor p-n junction device having a monocrystalline body, preferably of silicon, is equipped with connector leads which are punched out of sheet material and are soldered to the electrodes of the device. Each connector lead has at least one springy clamping lug protruding toward the other connector lead and located beside a clamping lug of another connector lead. The semiconductor body is clamped between the lugs of two adjacent connector leads and is soldered thereto.

2 Claims, 5 Drawing Figures

METHOD OF MAKING SEMICONDUCTOR COMPONENT WITH SHEET METAL CONNECTOR LEADS

The present application is a divisional of application Ser. No. 18,797, filed Mar. 16, 1970, now abandoned which in turn is a continuation of application Ser. No. 719,193, filed Apr. 5, 1968, now abandoned.

The invention relates to a semiconductor p-n junction device with a semiconductor body of monocrystalline material preferably silicon, whose electrodes, pertaining to the *p*-type and *n*-type regions of the crystalline body, are soldered to respective connector leads of metal formed by punchings of foil or sheet material.

The manufacture of such semiconductor devices has involved considerable difficulties and cost due mainly to the amount of work needed prior to the soldering operation for properly mounting the usually minute semiconductor body between the connector leads.

It is an object of our invention to minimize such difficulties and cost.

To this end, and in accordance with our invention we provide each connector lead in a semiconductor device of the above-mentioned kind with one or more springy clamping lugs directed toward the other connector lead and located beside the clamping lug of the other connector lead. We further clamp the semiconductor body between the springy clamping lugs of two adjacent connector leads and solder the body to the lugs.

The production of such a semiconductor device is considerably simplified because the connector leads, including any interconnecting bridging portion, may be punched out of a strip of sheet material in such a manner that all of the connector leads still remain interconnected at one of the respective ends through an auxiliary bridging piece. This bridging piece not only secures the spatial coordination of the individual connector leads during soldering operation, but also has the consequence that when the individual connector leads are being bent out of their originally common plane, they will spring back into this plane. For preparing the soldering of the semiconductor bodies to the connector leads, this being preferably done by immersion soldering, the semiconductor bodies need only be clamped between the lugs of two adjacent connector leads. The force then exerted by the springy lugs upon the semiconductor body, presuming a corresponding dimensioning of the sheet out of which the connector leads are punched, will be sufficient to hold the semiconductor bodies in the desired position during the immersion soldering operation. The soldering results in a structural unit, for example a completely wired rectifier bridge network inclusive of its connector leads, so that the auxiliary bridging piece can now be severed off, if desired after the entire unit is embedded in a casting or pressing mass from which only the connector leads and the auxiliary bridging piece protrude.

As a rule it will be sufficient if one of the two connector leads required for holding the crystalline semiconductor body is provided with but a single lug which projects between two lugs of the other connector lead. Each of the two connector leads, however, may also be given any desired number of lugs which are arranged in meshing relation to the lugs of the other lead. Furthermore, electrically parallel connected semiconductor bodies may be soldered between these teeth or lugs of the mesh arrangements. The lugs may be given any desired shape for example rectangular, triangular or semicircular shape.

Particular advantages are offered by the invention if at least a middle conector lead is provided between two outer connector leads of a single device unit, and if the middle connector lead is provided with lugs complementary to those of the respective adjacent connector leads. A semiconductor body or several such bodies operating electrically in parallel can then be soldered between the lugs of two such adjacent connector leads. The semiconductor bodies may have respective regions of the same doping type in connection with one and the same connector lead, or differently doped regions of the respective semiconductors may be connected with the same connector lead, depending upon whether a series connection composed of at least two semiconductor bodies or a mid-point circuit is involved, or whether the connector lead is to constitute a direct-voltage terminal or an alternating-voltage terminal of a bridge network.

Adjacent connector leads of a unit having several such connector leads, may extend toward one and the same side away from the lugs or they may extend alternately toward different, mutually opposed directions away from these lugs. Accordingly the connector leads may be provided with bridging pieces on one or on both sides, and individual bridging pieces may serve the function of electrical connections which are not severed off upon completion of the structural unit.

In an arrangement in which the connector leads alternately extend in opposed directions away from the lugs, the semiconductor bodies are preferably soldered between the lugs of adjacent connector leads in such a manner that all connector leads protruding toward one side constitute direct-current terminals, and all connector leads protruding to the other side constitute alternating-current terinals of a multiphase rectifier bridge.

The structural unit obtained after performing the soldering operation may be embedded in an insulating casting or pressing mass out of which only the connector leads protrude. However the soldered unit may also be inserted into a flat housing of synthetic plastic whose lateral walls are provided with guide-slots for the two outermost connector leads; and the inner space of the housing may then be filled with a casting or pressing mass. Suitable for this purpose are thermoplastics or duroplastics, a hardener and a softener being preferably added to the latter. A further addition of silicone resin permits making these masses virtually impermeable to water.

Several embodiments of the invention will be further described by way of example with reference to the accompanying drawing in which.

Figure 1:
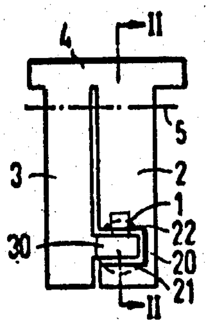
FIG. 1 shows an embodiment with a semiconductor body fastened between two connector leads.

Functionally corresponding items are designated by the same reference characters in all figures. Thus, the semiconductor member is denoted by 1, the connector leads by numerals 2 and 3, the auxiliary bridging pieces by numeral 4, and the housing by numeral 6.

FIG. 1 illustrates two connector leads 2 and 3 which project away from an auxiliary bridging piece 4 and extend substantially parallel to each other, being separated by a relatively narrow, punched-out slit.

Figure 2:
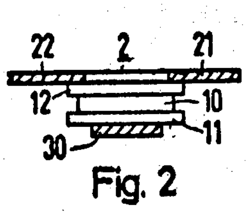
FIG. 2 is a section along the line II—II in FIG. 1.

The connector lead 3 has a lug 30 which protrudes into a corresponding recess 20 surrounded by protrusions or lugs 21 and 22. The semiconductor member 1 is located between the protrusions 21, 22 and the protrusion 30. The member 1, as particularly apparent from FIG. 2, consists of a semiconductor body 10 of monocrystalline material, particularly silicon, having at least one p-n junction to whose electrodes there are fastened, for example by soldering, particular electrode bodies 11 and 12. The semiconductor member is held in the position shown in FIG. 2 by the restoring force of the connector leads 2 and 3 bent out of their originally common plane, and this holding effect persists during the subsequent soldering operation. After such soldering operation, the unit illustrated in FIG. 1 can be cut along the line 5.

Figure 3:
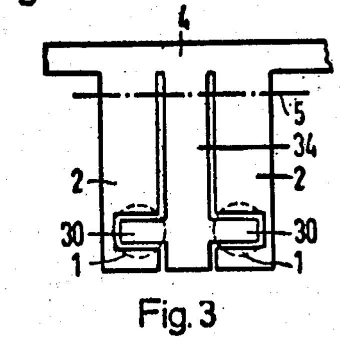
FIG. 3 shows an embodiment with two semiconductor bodies between three connector leads.

FIG. 3 shows a twin device with a middle connector lead 34 which is in meshing relation on two sides through protruding lugs 30 with complementary recesses of two adjacent connector leads 2. Semiconductor members denoted by 1 are located between each two adjacent connector leads. These members may be connected with the middle connector lead 34 at respective regions doped for the same type of conductivity, or doped for different types of conductivity respectively. Consequently, this unit constitutes a mid-point circuit or two branches of a rectifier bridge.

The three connector leads are originally connected with each other by an auxiliary bridging piece 4 which is severed off along the line 5 after the soldering operation or, as the case may be, after embedding the unit by pressing into an insulating material.

Figure 4:
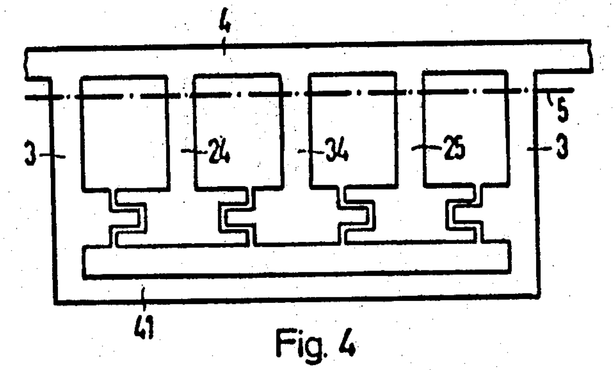
FIG. 4 is a plan view of a punching for a rectifier bridge with an internal connection of the two outer connector leads.

The punching shown in FIG. 4 can be used for constructing a rectifier bridge. For this purpose, the semiconductor bodies are placed between the individual connector leads in such a manner that the connector lead 24 interconnects regions having the same type of doping, while the connector lead 25 interconnects regions having all thè same doping of the other type. These two connector leads then constitute the direct-current terminals of the bridge, whereas the alternating-voltage terminals are formed by the connector leads 3 and 34. The two outer connector leads 3 are connected with each other through a bridging piece 41, so that only the middle connector lead 34 and one of the two outer connector leads 3 need by connected with the alternating-voltage supply lines. It is advisable to select the spacing betwen the connecting leads so that it corresponds to the standardized raster dimension (2.5 mm or n. 2.5).

Figure 5:
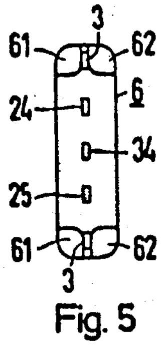
FIG. 5 is a cross section through a housing with a rectifier bridge according to FIG. 4.

FIG. 5 shows in cross section a housing with a rectifier bridge formed with the aid of a punching according to FIG. 4. The punching is held in the housing 6 at the two outer connector leads 3 between projections 61 and 62.

We claim:

1. A method of producing a semiconductor device component with at least one semiconductor body of monocrystalline material having at least one p-n junction and one first electrode which is provided with a projection of a first connection lead comprising sheet metal and one second electrode provided with a second connecting lead comprising sheet metal, which comprises:

a. punching out the first and the second connecting leads from a single piece of sheet metal so that said connecting leads remain interconnected via an auxiliary bridge, while the ends of said connecting leads situated opposite said auxiliary bridge are punched out simultaneously so that said first connecting lead has a projection and said second connecting lead has a recess into which said second connecting lead extends, at least one of the connecting leads being punched out so that it has a second recess which is positioned on the side facing away from said projection;

b. clamping a semiconductor body between the projection of said first connecting lead and the end of said second connecting lead opposite said auxiliary bridge;

c. soldering the projection of said first connecting lead with the first electrode and soldering the second connecting lead with the second electrode;

d. installing the connecting leads and the semiconductor bodies into an insulated housing and removing the auxiliary bridge;

e. the method also including simultaneously punching out a third, fourth and fifth connecting lead with the two first connecting leads, which are positioned adjacent to the first and second connecting leads and extend in parallel thereto, the first and fifth outer connecting leads having one projection, respectively, and the second, third and fourth connecting leads having two projections each, so that a total of four semiconductor bodies can be clamped and soldered between and with said projections; and f. punching out simultaneously with the connecting leads, a lead interconnecting the first and the fifth connecting leads, said interconnecting lead extending on the side of the connecting leads facing away from the auxiliary path, whereby the semiconductors are so clamped with respect to their forward direction, between said projections, and soldered thereon, that a single phase rectifier bridge results.

2. A method of producing a semiconductor device with at least four semiconductor bodies and at least five sheet metal connecting leads arranged to form a rectifier bridge which comprises;

a. punching out five connecting leads from a single piece of sheet metal so that said connecting leads remain interconnected via an auxiliary bridge, b. simultaneously punching the ends of said connecting leads situated opposite said auxiliary bridge to form clamping lugs therewith while an additional connecting lead remains interconnected with the first and fifth connecting leads, c. clamping said four semiconductor bodies between pairs of adjacent clamping lugs, d. soldering said clamping lugs to said semiconductor bodies, e. embedding the connecting leads and semiconductor bodies into an insulated housing while said auxiliary bridge and said additional connecting lead remain intact, f. and removing said auxiliary bridge after the connecting leads and semiconductor bodies have been embedded in said insulated housing.

* * * * *